(12) United States Patent
Wu et al.

(10) Patent No.: US 10,734,338 B2
(45) Date of Patent: Aug. 4, 2020

(54) BONDING PAD, SEMICONDUCTOR STRUCTURE, AND METHOD OF MANUFACTURING SEMICONDUCTOR STRUCTURE

(71) Applicant: NANYA TECHNOLOGY CORPORATION, New Taipei (TW)

(72) Inventors: Pei-Jhen Wu, Taipei (TW); Chiang-Lin Shih, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/268,954

(22) Filed: Feb. 6, 2019

(65) Prior Publication Data

US 2020/0168573 A1 May 28, 2020

Related U.S. Application Data

(60) Provisional application No. 62/770,952, filed on Nov. 23, 2018.

(51) Int. Cl.
*H01L 23/52* (2006.01)
*H01L 23/00* (2006.01)
*H01L 23/522* (2006.01)

(52) U.S. Cl.
CPC .......... *H01L 24/05* (2013.01); *H01L 23/5226* (2013.01); *H01L 24/03* (2013.01);
(Continued)

(58) Field of Classification Search
CPC ...... H01L 24/05; H01L 23/5226; H01L 24/03
(Continued)

(56) References Cited

U.S. PATENT DOCUMENTS

2006/0289999 A1* 12/2006 Lee .................. H01L 21/76807
257/762
2007/0290361 A1* 12/2007 Chen .................. H01L 23/5226
257/773

(Continued)

FOREIGN PATENT DOCUMENTS

TW 200701397 A 1/2007
TW I319614 B 1/2010

*Primary Examiner* — Sheikh Maruf
(74) *Attorney, Agent, or Firm* — Muncy, Geissler, Olds & Lowe, P.C.

(57) ABSTRACT

The present disclosure relates to a multi-ring bonding pad, a semiconductor structure having the multi-ring bonding pad, and a method of manufacturing the semiconductor structure. The bonding pad includes an inner ring member, an outer ring member, and multiple bridge members. The inner ring member has a pair of first inner edges opposite to each other, a pair of second inner edges opposite to each other, and multiple third inner edges for connecting the first inner edges to the second inner edges. The outer ring member surrounds the inner ring member and has a pair of first outer edges opposite to each other, a pair of second outer edges opposite to each other, and multiple third outer edges for connecting the first outer edges to the second outer edges. The bridge members are disposed between the inner ring member and the outer ring member for connecting the inner ring member to the outer ring member.

12 Claims, 16 Drawing Sheets

(52) U.S. Cl.
CPC ............................. *H01L 2224/039* (2013.01); *H01L 2224/0509* (2013.01); *H01L 2224/05013* (2013.01); *H01L 2224/05083* (2013.01)

(58) Field of Classification Search
USPC ........................................................ 257/773
See application file for complete search history.

(56) References Cited

U.S. PATENT DOCUMENTS

2014/0273453 A1* 9/2014 Sakuma ................. H01L 21/78
438/687
2015/0364434 A1* 12/2015 Chen ..................... H01L 23/498
257/773

* cited by examiner

BONDING PAD, SEMICONDUCTOR STRUCTURE, AND METHOD OF MANUFACTURING SEMICONDUCTOR STRUCTURE

PRIORITY CLAIM AND CROSS-REFERENCE

This application claims the priority benefit of U.S. provisional application Ser. No. 62/770,952, filed on Nov. 23, 2018. The entirety of the above-mentioned patent application is hereby incorporated by reference herein and made a part of this specification.

TECHNICAL FIELD

The present disclosure relates to a bonding pad, a semiconductor structure, and a method of manufacturing the semiconductor structure, and more particularly, to a multi-ring bonding pad, a semiconductor structure including the bonding pad, and a method of manufacturing the semiconductor structure.

DISCUSSION OF THE BACKGROUND

The process flow for fabrication of integrated semiconductor circuits may include front-end-of-line (FEOL), middle-end-of-line (MEOL), and back-end-of-line (BEOL) processes. The FEOL process may include wafer preparation, isolation, well formation, gate patterning, spacer, extension and source/drain implantation, silicide formation, and dual stress liner formation. The MEOL process may include gate contact formation. The BEOL processes may include a series of wafer processing steps for interconnecting the semiconductor devices created during the FEOL and MEOL processes. Successful fabrication and qualification of modern semiconductor chip products requires consideration of interplay between the materials and the processes employed.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a bonding pad. The bonding pad includes an inner ring member, an outer ring member, and a plurality of bridge members. The inner ring member has a pair of first inner edges being opposite to each other, a pair of second inner edges being opposite to each other, and a plurality of third inner edges disposed at corners defined by extending lines of the first inner edges and the second inner edges. The first inner edges are connected to the second inner edges through the third inner edges. The outer ring member encircles the inner ring member and is spaced apart from the inner ring member. The outer ring member has a pair of first outer edges being opposite to each other, a pair of second outer edges being opposite to each other, and a plurality of third outer edges disposed at corners defined by extending lines of the first outer edges. The first outer edges are connected to the second outer edges through the third outer edges. The bridge members are disposed between the inner ring member and the outer ring member and connect the inner ring member to the outer ring member.

In some embodiments, an included angle between the third inner edge and the first inner edge is about 135 degrees, and an included angle between the third inner edge and the second inner edge is about 135 degrees.

In some embodiments, the first outer edges are substantially parallel to the first inner edges, and the second outer edges are substantially parallel to the second inner edges.

In some embodiments, a first distance between two adjacent bridge members connected to the first inner edges is substantially less than a second distance between two adjacent bridge members connected to the second inner edges.

In some embodiments, the inner ring member further includes a plurality of inner notches disposed on the first inner edges and the second inner edges and a plurality of outer notches disposed on the first outer edges and the second outer edges.

In some embodiments, the inner notches are equidistant from the third inner edges, and the outer notches are equidistant from the third outer edges.

In some embodiments, the inner notches are arranged at positions between the third inner edges and the bridge member disposed closest to the third inner edges, and the outer notches are disposed at positions between the third outer edges and the bridge member disposed closest to the third outer edges.

In some embodiments, the inner notch and the outer notch, disposed on the first inner edge and first outer edge, respectively, or disposed on the second inner edge and the second outer edge, respectively, are arranged away from each other.

In some embodiments, the inner ring member and the outer ring member have a uniform width.

In some embodiments, the width of the inner ring member is equal to twice a width of the bridge members.

Another aspect of the present disclosure provides a semiconductor structure. The semiconductor structure includes a multilayer component, a dielectric layer, and a bonding pad. The dielectric layer is disposed on the multilayer component. The bonding pad is disposed in the dielectric layer and includes an inner ring member, an outer ring member, and a plurality of bridge members. The inner ring member has a pair of first inner edges being opposite to each other, a pair of second inner edges being opposite to each other, and a plurality of third inner edges disposed at corners defined by extending lines of the first inner edges and the second inner edges. The first inner edges are connected to the second inner edges through the third inner edges. The outer ring member encircles the inner ring member and is spaced apart from the inner ring member. The outer ring member has a pair of first outer edges being opposite to each other, a pair of second outer edges being opposite to each other, and a plurality of third outer edges disposed at corners defined by extending lines of the first outer edges and the second outer edges. The first outer edges are connected to the second outer edges through the third outer edges. The bridge members are disposed between the inner ring member and the outer ring member and connect the inner ring member to the outer ring member.

In some embodiments, the multilayer component includes a main component, an insulating layer, and at least one via; wherein the insulating layer is disposed on the main component, the via is disposed in the insulating layer, and the main component is electrically coupled to the bonding pad through the via.

Another aspect of the present disclosure provides a method of manufacturing a semiconductor structure. The method includes steps of providing a multilayer component; depositing a dielectric layer on the multilayer component; creating a recessed pattern in the dielectric layer; and depositing a metallic layer in the recessed pattern.

In some embodiments, the metallic layer extends along an upper surface of the dielectric layer and into the recessed pattern.

In some embodiments, the method further includes a step of performing a planarizing process to remove a portion of the metallic layer above the upper surface.

In some embodiments, the method further includes a step of performing a polishing process to obtain a flat upper surface of the dielectric layer.

In some embodiments, the method further includes steps of depositing a barrier layer on the dielectric layer and into the recessed pattern before the deposition of the metallic layer; and depositing a seed layer on the barrier layer.

In some embodiments, the barrier layer and the seed layer are substantially conformal layers.

In some embodiments, the creating of the recessed pattern includes steps of coating a photoresist layer on the dielectric layer; patterning the photoresist layer to form at least one opening in the photoresist, wherein a portion of the dielectric layer is exposed through the opening; and performing an etching process to remove a portion of the dielectric layer exposed through the opening to form the recessed pattern.

In some embodiments, the metallic layer is in contact with the multilayer component.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
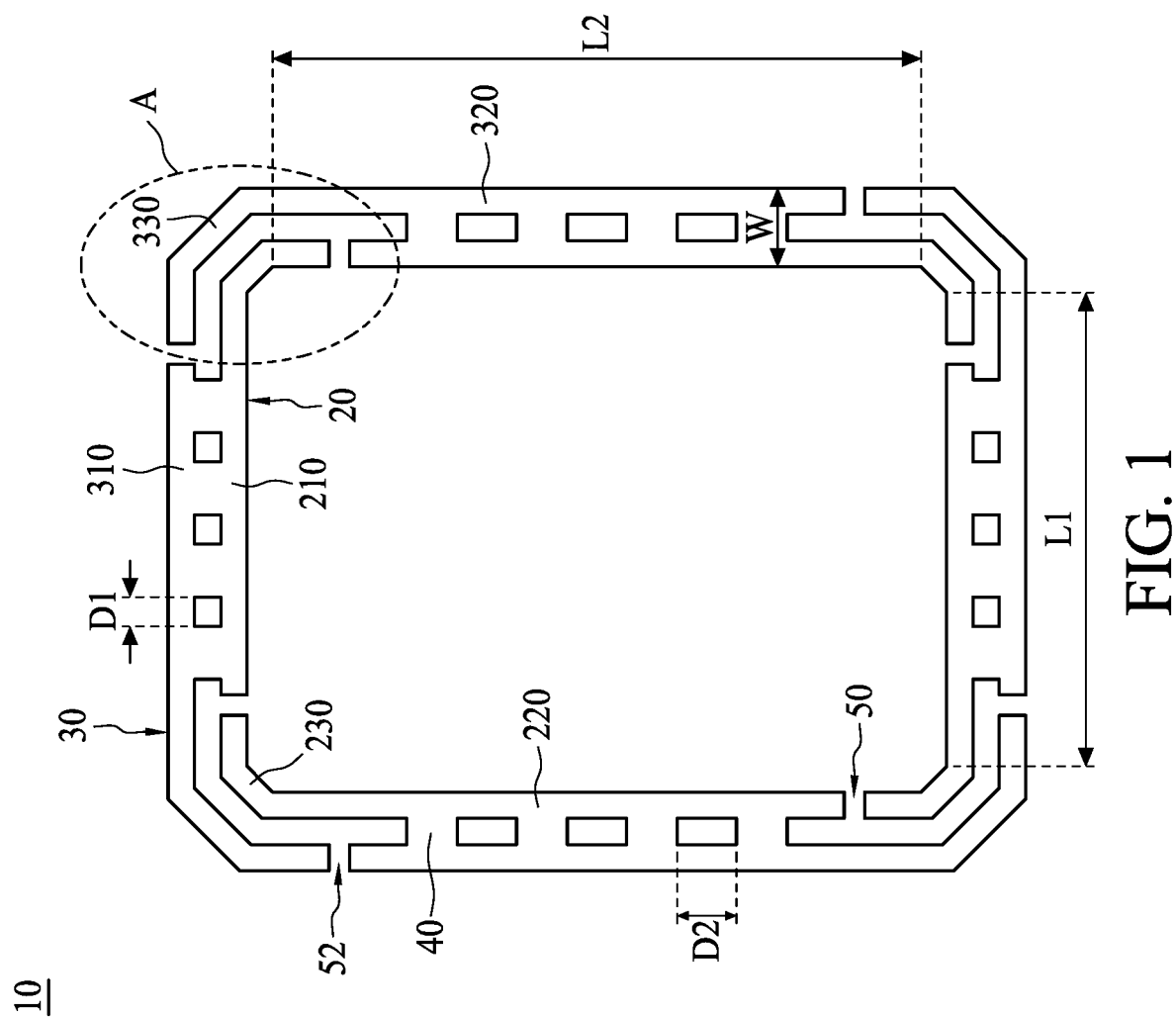
FIG. 1 is a top view of a bonding pad, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a top view of a bonding pad 10 in accordance with some embodiments of the present disclosure. Referring to FIG. 1, the bonding pad 10 includes an inner ring member 20, an outer ring member 30 encircling the inner ring member 20 and spaced apart from the inner ring member 20, and a plurality of bridge members 40 disposed between the inner ring member 20 and the outer ring member 30 for connecting the inner ring member 20 to the outer ring member 30. In some embodiments, the bonding pad 10 may be used as a first metal layer (i.e., an M1 layer) or a second metal layer (i.e., an M2 layer) of a semiconductor device such as a dynamic random access memory (DRAM). In some embodiments, contours of the bonding pad 10 are designed to relieve stress caused during a planarizing process such as a chemical mechanical polish (CMP) process.

In some embodiments, the inner ring member 20 has a pair of first inner edges 210 being opposite to each other, a pair of second inner edges 220 being opposite to each other, and a plurality of third inner edges 230 for connecting the first inner edges 210 to the second inner edges 220. In some embodiments, the first inner edges 210 are not directly connected to the second inner edges 220. In some embodiments, the first inner edges 210 have a first length L1, and the second inner edges 220 have a second length L2 greater than the first length L1.

Figure 2:
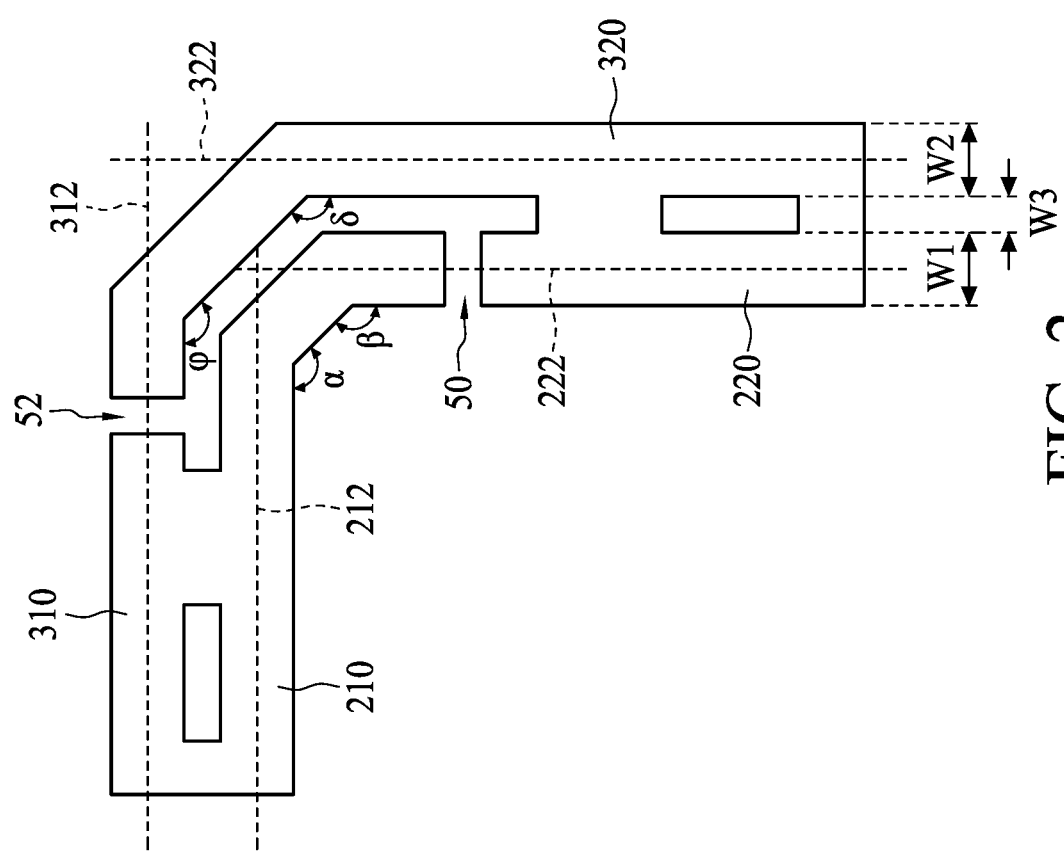
FIG. 2 is a close-up view of an area A of FIG. 1.

FIG. 2 is a close-up view of an area A of FIG. 1. Referring to FIGS. 1 and 2, in some embodiments, the third inner edges 230 are disposed at a plurality of corners defined by extending lines 212, 222 of the first inner edges 210 and the second inner edges 220. In some embodiments, the extending line 212 of the first inner edge 210 may be perpendicular to the extending line 222 of the second inner edge 220. In some embodiments, an included angle α between the first inner edge 210 and the third inner edge 230 is about 135 degrees, and an included angle β between the second inner edge 220 and the third inner edge 230 is about 135 degrees; such configuration serves to release stress during the planarizing process, as will be explained below.

In some embodiments, the outer ring member 30 has a pair of first outer edges 310 being opposite to each other, a pair of second outer edges 320 being opposite to each other, and a plurality of third outer edges 330 connecting the first outer edges 310 to the second outer edges 320. In some embodiments, the first outer edges 310 are not directly connected to the second outer edges 320. In some embodiments, the first outer edges 310 are substantially parallel to the first inner edges 210, the second outer edges 320 are substantially parallel to the second inner edges 220, and the third outer edges 330 are substantially parallel to the third inner edges 230.

In some embodiments, the third outer edges 330 are disposed at corners defined by extending lines 312, 322 of the first outer edges 310 and the second outer edges 320. In some embodiments, the extending line 312 of the first outer edge 310 may be perpendicular to the extending line 322 of the second outer edge 320. In some embodiments, to relieve stress, an included angle φ between the first outer edge 310 and the third outer edge 330 is about 135 degrees, and an included angle δ between the second outer edge 320 and the third outer edge 330 is about 135 degrees.

In some embodiments, the bridge members 40 are disposed between the inner ring member 20 and the outer ring member 30, and the inner ring member 20 is connected to the outer ring member 30 through the bridge members 40. In some embodiments, the bridge members 40 are disposed between the first inner edges 210 and the first outer edges 310 and between the second inner edges 220 and the second outer edges 320. In some embodiments, the bridge members 40 are not disposed between the third inner edges 230 and the third outer edges 330. In some embodiments, a distance D1 between two adjacent bridge members 40 connected to the first inner edges 210 is substantially less than a distance D2 between two adjacent bridge members 40 connected to the second inner edges 220 since the bridge members 40 have a uniform dimension and the first length L1 of the first inner edges 210 is less than the second length L2 of the second inner edges 220. In some embodiments, spaces between two adjacent bridge members 40 may be used for dissipating heat and dispersing stress, and may be designed to prevent over-polish during the planarizing process.

In some embodiments, the inner ring member 20 further includes a plurality of inner notches 50 respectively disposed on the first inner edges 210 and the second inner edges 220. In some embodiments, the inner notches 50 are equidistant from the third inner edges 230. In some embodiments, the inner notches 50 are arranged at positions between the third inner edges 230 and the bridge member 40 disposed closest to the third inner edges 230.

In some embodiments, the outer ring member 30 further includes a plurality of outer notches 52 respectively disposed on the first outer edges 310 and the second outer edges 320. In some embodiments, the outer notches 52 are equidistant from the third outer edges 330. In some embodiments, the outer notches 52 are disposed at positions between the third outer edges 330 and the bridge member 40 disposed closest to the third outer edges 330. In some embodiments, the inner notch 50 and the outer notch 52, disposed on the first inner edge 210 and first outer edge 310, respectively, or disposed on the second inner edge 220 and the second outer edge 320, respectively, are arranged away from each other for preventing a loop current from being induced by electromagnetic flux change when the electricity is supplied to the semiconductor device having the bonding pad 10. In some embodiments, the discontinuous contour of the bonding pad 10 may reduce noise propagation therethrough.

Referring again to FIGS. 1 and 2, in some embodiments, the bonding pad 10 has a width W, which may be, for example, in a range between 2.70 and 6.0 micrometers (μm), such as about 2.75 μm. In some embodiments, the inner ring member 20 has a first width W1, the outer ring member 30 has a second width W2 substantially equal to the first width W1, and the bridge members 40 have a third width W3 substantially less the first width W1. In some embodiments, the third width W3 may be equal to one-half of the first width W1. For example, the first width W1 and the second width W2 are about 1.1 μm, and the third width W3 is about 0.55 μm. In some embodiments, the inner ring member 20, the outer ring member 30 and the bridge members 40 are integrally formed. In some embodiments, the bonding pad 10 is made of metallic material such as copper or aluminum.

Figure 3:
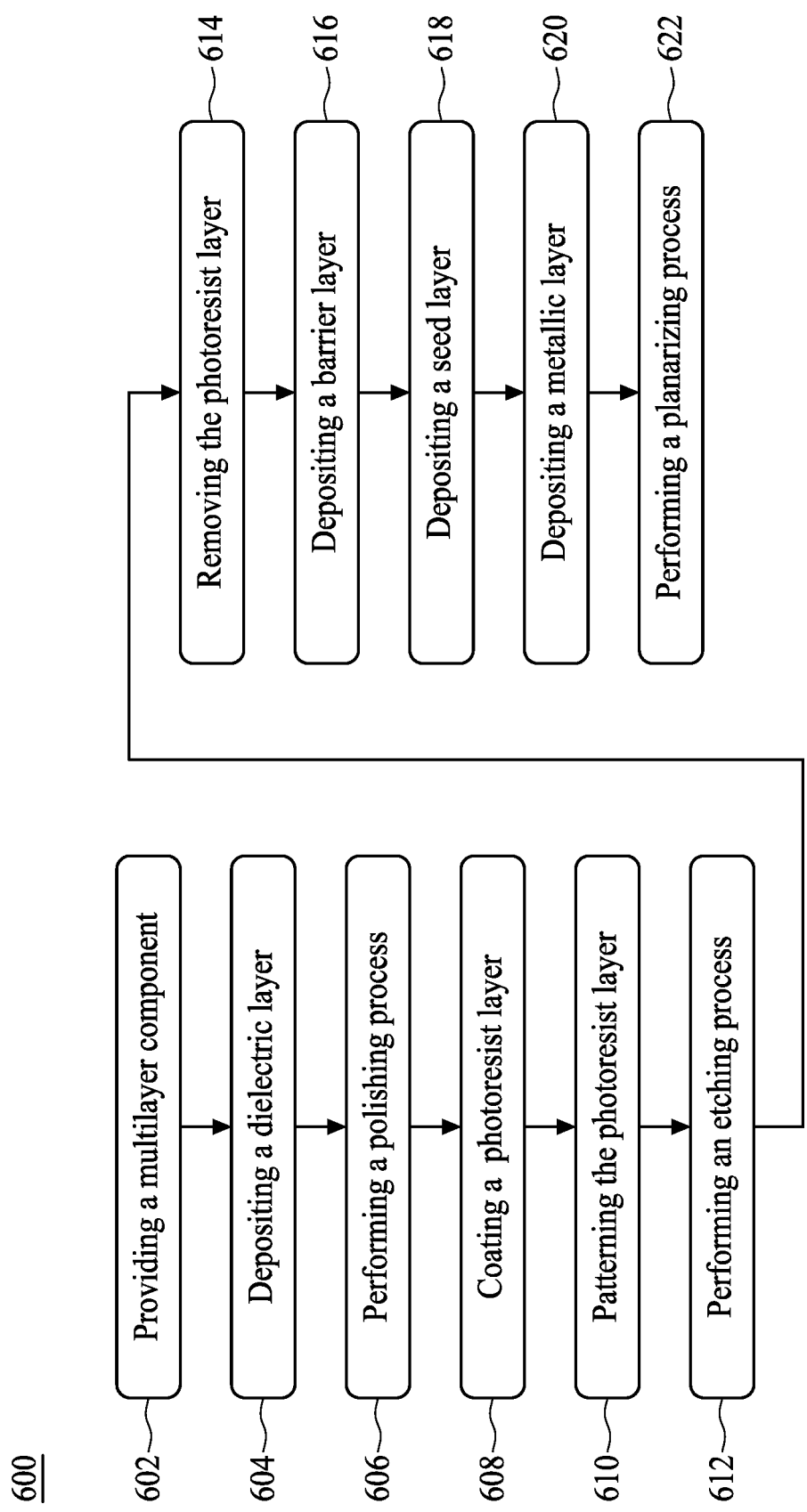
FIG. 3 is a flow diagram illustrating a method of manufacturing semiconductor devices, in accordance with some embodiments of the present disclosure.

FIG. 3 is a flow diagram illustrating a method 600 of manufacturing a semiconductor structure 70/70A in accordance with some embodiments of the present disclosure. FIGS. 4 to 12 are schematic diagrams illustrating various fabrication stages constructed according to the method 600 for manufacturing the semiconductor structure 70 in accordance with some embodiments of the present disclosure. The stages shown in FIGS. 4 to 12 are also illustrated schematically in the flow diagram in FIG. 3. In the subsequent discussion, the fabrication stages shown in FIGS. 4 to 12 are discussed in reference to the process steps in FIG. 3.

Figure 4:
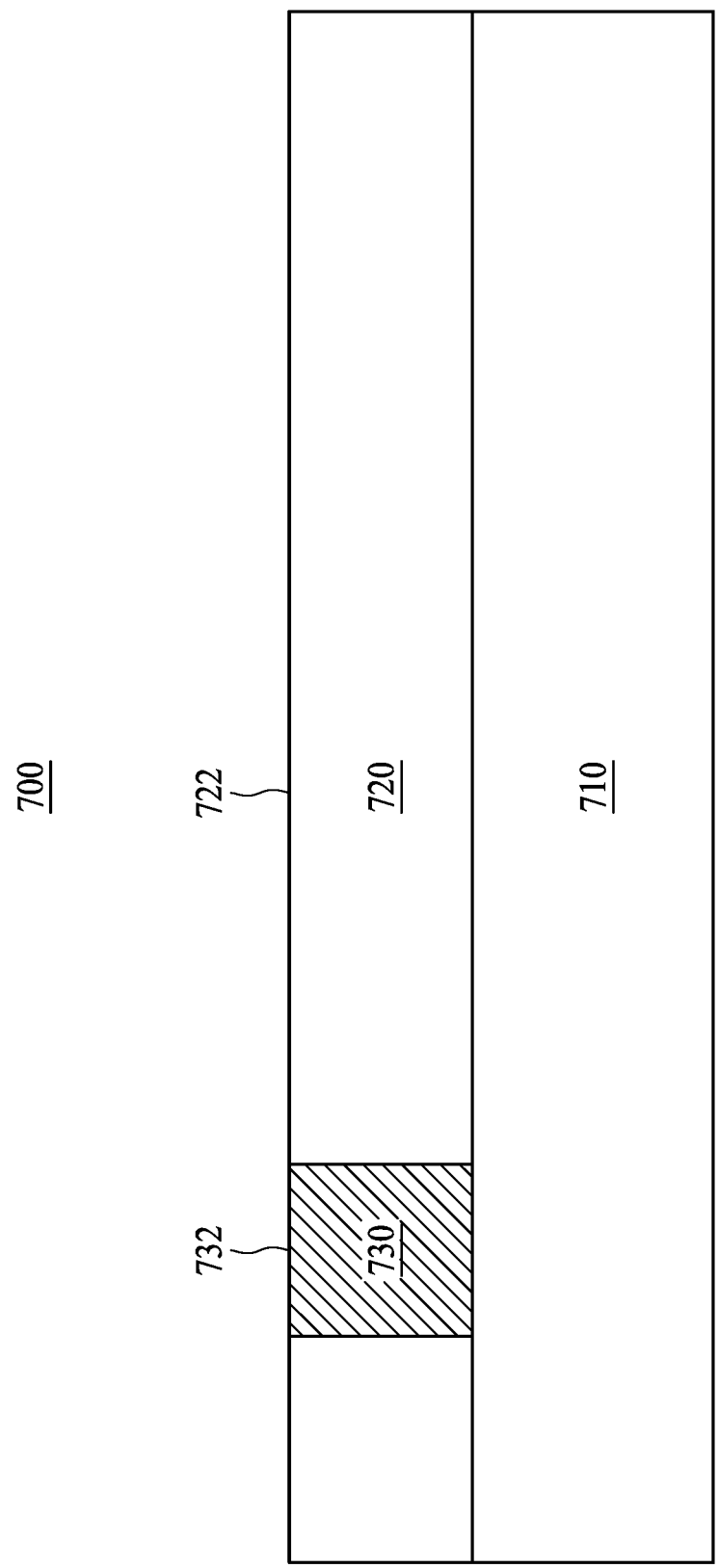
FIGS. 4 through 11 illustrate cross-sectional views of intermediate stages in the formation of a semiconductor structure, in accordance with some embodiments of the present disclosure.

Referring to FIG. 4, a multilayer component 700 is provided according to a step 602 in FIG. 3. In some embodiments, the multilayer component 700 may include a main component 710 including one or more features, such as transistors, resistors, capacitors, diodes, dielectrics, vias, etc. In some embodiments, the multilayer component 700 may further include an insulating layer 720 covering the main component 710 and at least one via 730 disposed in the insulating layer 720. In some embodiments, an end surface 732 of the via 730 is coplanar with an upper surface 722 of the insulating layer 720. In some embodiments, the multilayer component 700 may be formed using conventional process steps.

Figure 5:
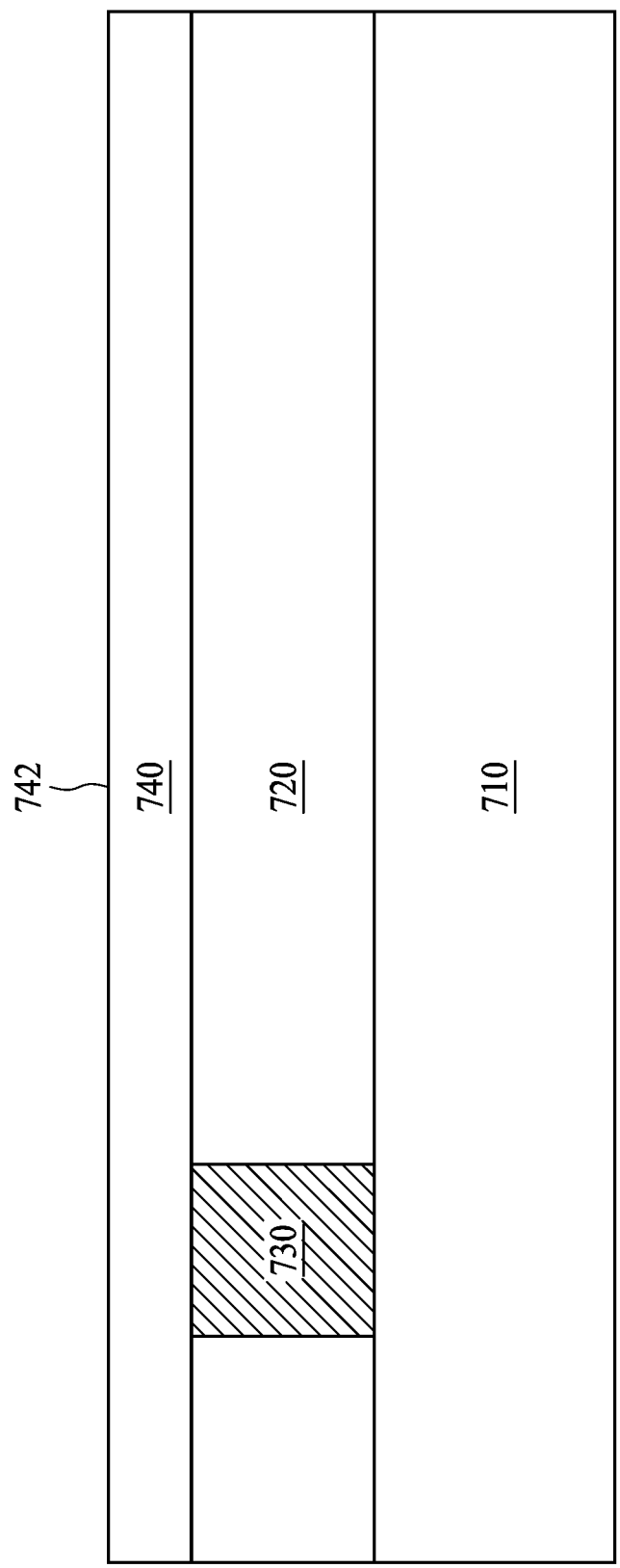

Referring to FIG. 5, in some embodiments, a dielectric layer 740 is deposited on the insulating layer 720 and the via 730 according to a step 604 in FIG. 3. In some embodiments, the dielectric layer 740 fully covers the insulating layer 720 and the via 730. In some embodiments, the dielectric layer 740 includes oxide. In some embodiments, the dielectric layer 740 may be formed by chemical vapor deposition (CVD), spin-on, or other suitable methods. In some embodiments, after the deposition of the dielectric layer 740, a polishing process may be performed according to a step 606 in FIG. 3 to obtain a flat upper surface 742 of the second dielectric layer 740.

Figure 6:
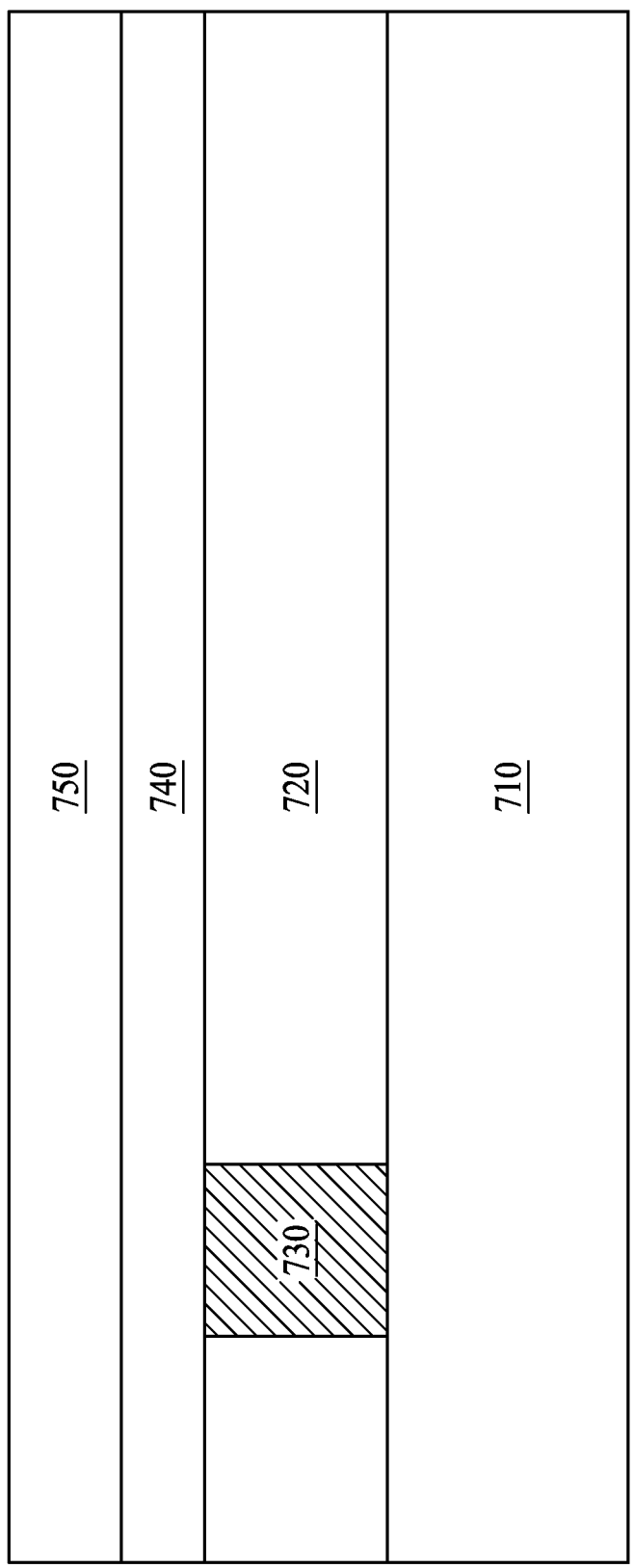
Figure 7:
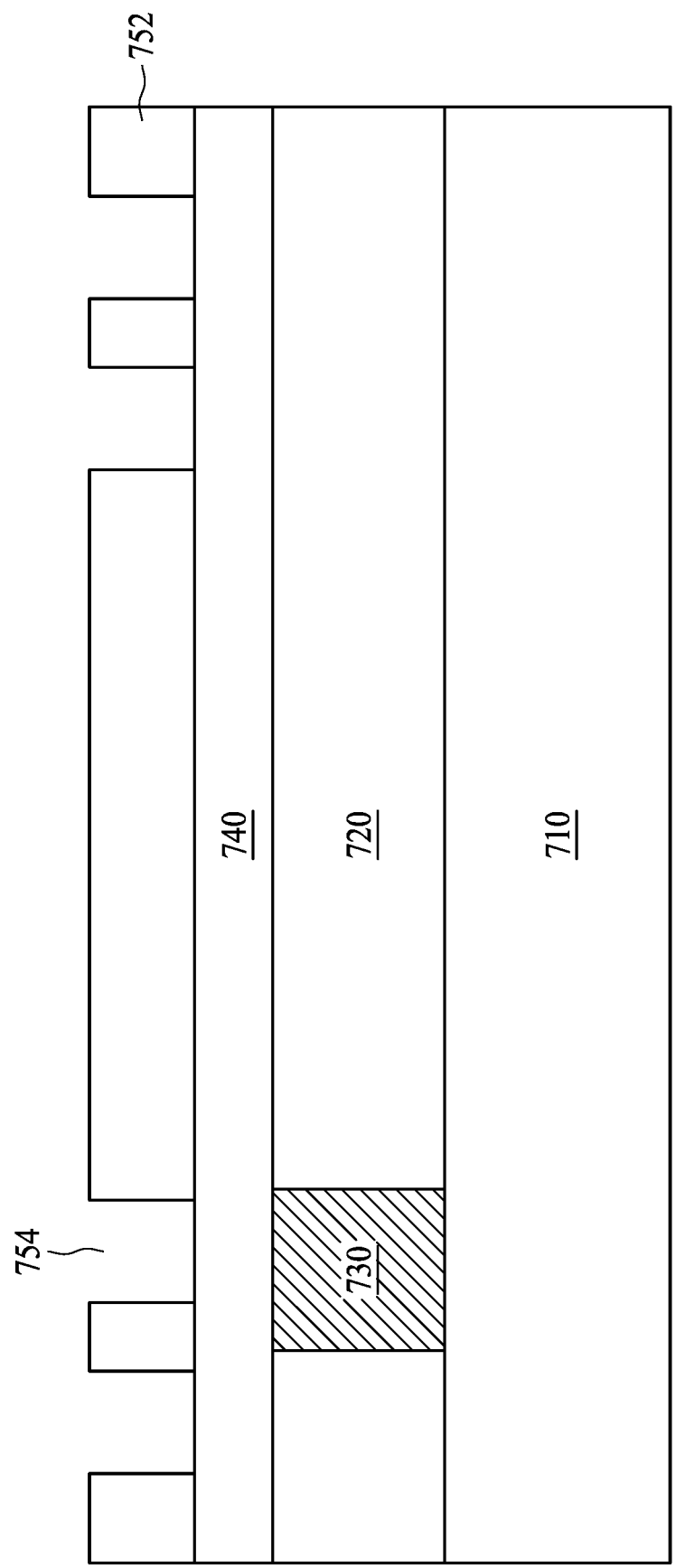

Referring to FIG. 6, in some embodiments, a photoresist layer 750 is coated on the second dielectric layer 740 according to a step 608 in FIG. 3. In some embodiments, the photoresist layer 750 is then patterned to define a region where the dielectric layer 740 is to be subsequently etched according to a step 610 in FIG. 3. In some embodiments, the photoresist layer 750 is patterned by steps including (1) exposing the photoresist layer 750 to a pattern (not shown), (2) performing a post-exposure back process, and (3) developing the photoresist layer 750, thereby forming a photoresist pattern 752, as shown in FIG. 7, having at least one opening 754. In some embodiments, a portion of the dielectric layer 740 to be subsequently etched is exposed through the openings 754. In some embodiments, the photoresist layer 740 may be patterned by, for example, electron-beam writing, ion-beam writing, or molecular imprint.

Figure 8:
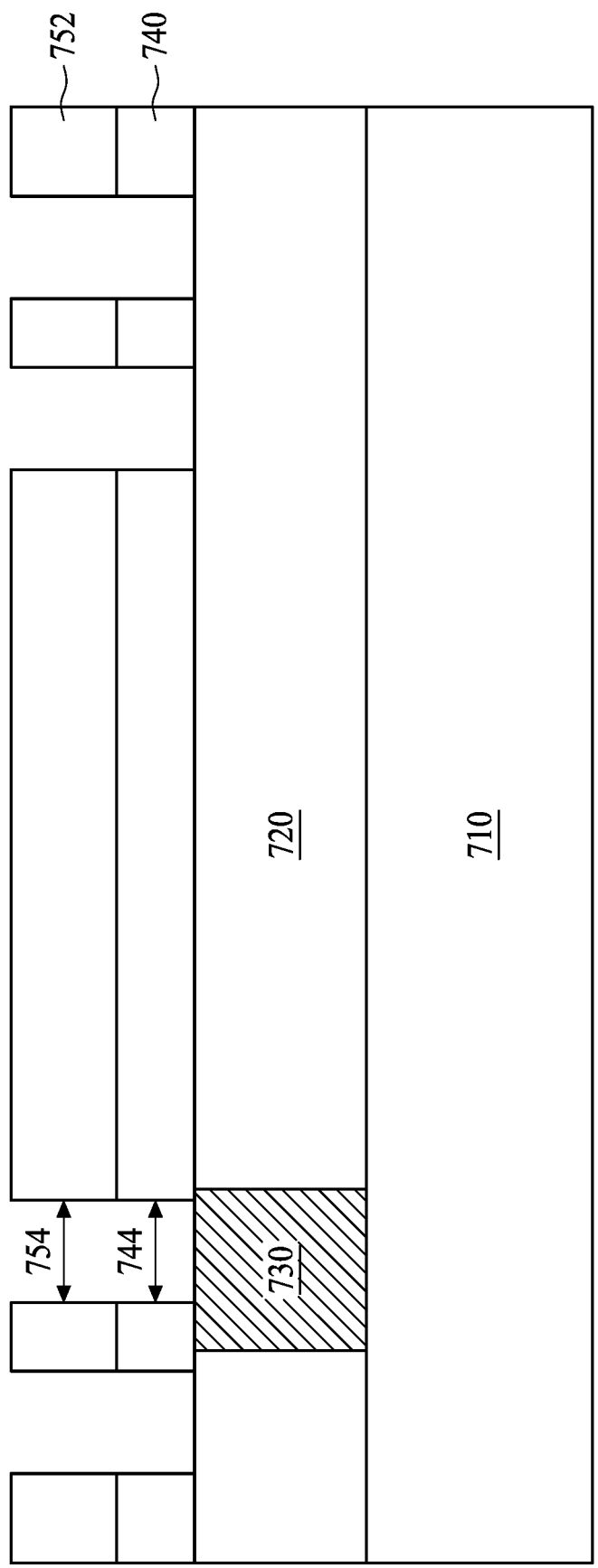

Referring to FIG. 8, in some embodiments, an etching process is performed to etch the dielectric layer 740 and thus define a recessed pattern 744 in the dielectric layer 740 according to a step 612 in FIG. 3. After the etching process, portions of the insulating layer 720 and the via 730 are exposed through the recessed pattern 744. In some embodiments, the etching process may be a single or a multiple step etching process. In some embodiments, the etching process includes a wet etching process, a dry etching process, or a combination thereof. In some embodiments, the dry etching process may be an anisotropic etching process. In some embodiments, the recessed pattern 744 may be formed to have contours corresponding to the contours of the bonding pad 10 shown in FIG. 1.

Figure 9:
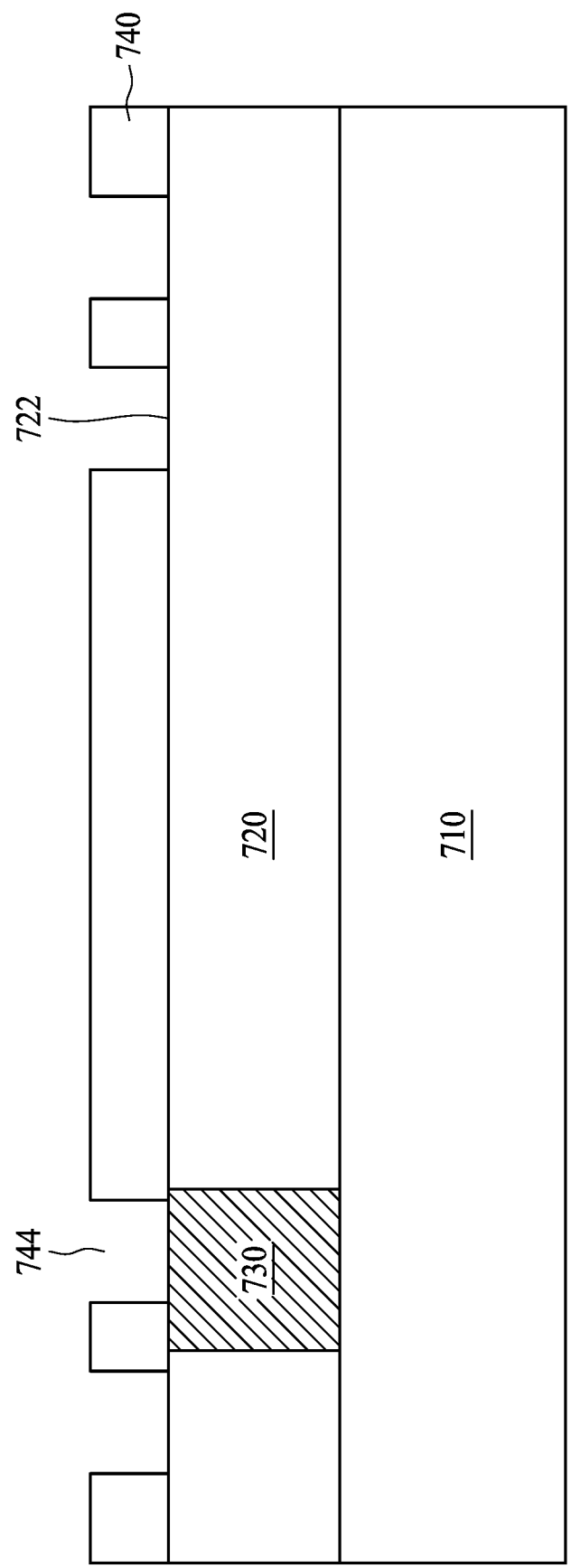

Referring to FIG. 9, after the etching process, the photoresist pattern 752 is removed according to a step 614 in FIG. 3. In some embodiments, an ashing process or a wet strip process may be used to remove the photoresist pattern 752, wherein the wet strip process may chemically alter the photoresist pattern 752 so that it no longer adheres to the remaining second dielectric layer 740.

Figure 10:
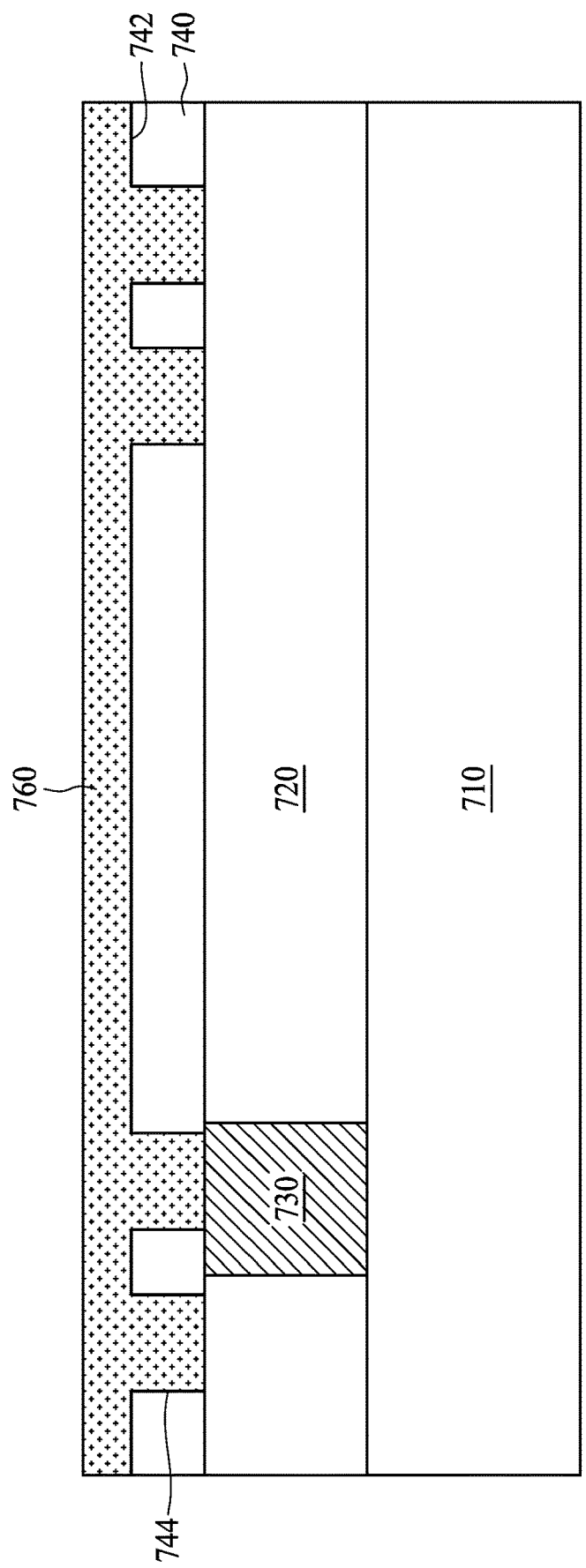

Referring to FIG. 10, in some embodiments, a metallic layer 760 is deposited on the dielectric layer 740 and into the recessed pattern 744 according to a step 620 in FIG. 3. In some embodiments, the metallic layer 760 extends along the upper surface 742 of the dielectric layer 740 and into the recessed pattern 744. In some embodiments, the metallic layer 760 has a thickness sufficient to fill the recessed pattern 744. In some embodiments, the metallic layer 760 is in contact with the via 730. In some embodiments, the metallic layer 760 includes copper or aluminum. In some embodiments, the metallic layer 760 is formed using a plating process.

Figure 11:
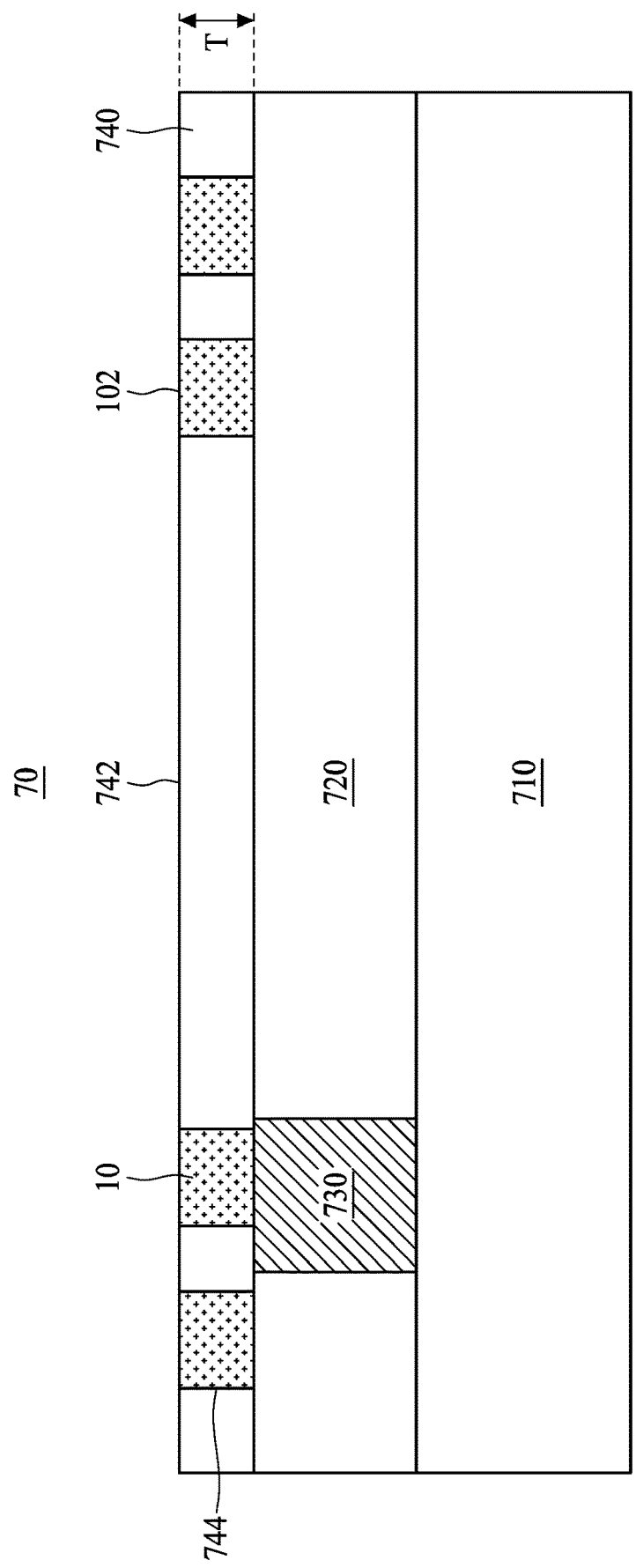
Figure 12:
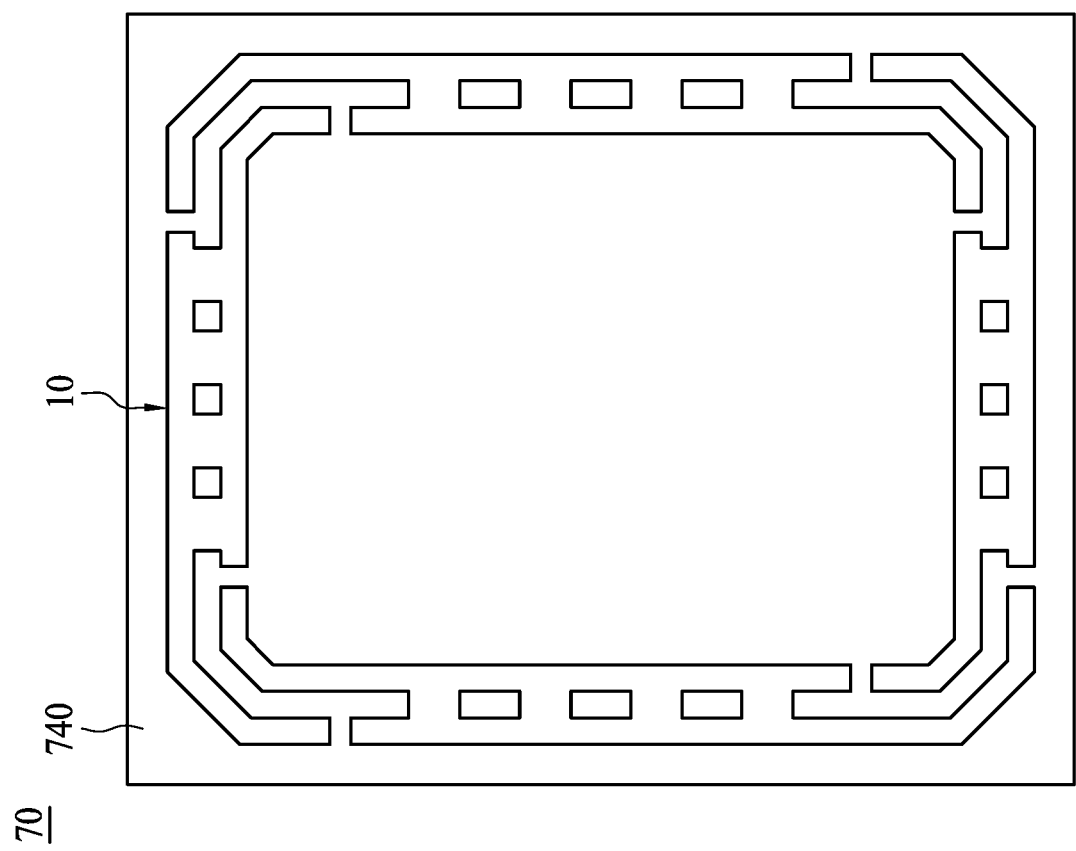
FIG. 12 illustrates a top view of an intermediate stage in the formation of the semiconductor structure, in accordance with some embodiments of the present disclosure.

Referring to FIGS. 11 and 12, in some embodiments, a planarizing process is performed to expose the dielectric layer 740 according to a step 622 in FIG. 3. As a result, the semiconductor structure 70 is completely formed, and a bonding pad 10 shown in FIG. 1 is formed in the dielectric layer 740. In some embodiments, the semiconductor structure 70 includes a main component 710, an insulating layer 720 disposed on the main component 710, at least one via 730 disposed in the insulating layer 720, a dielectric layer 740 disposed on the insulating layer 720 and the via 730, and a bonding pad 10 disposed in the dielectric layer 740 and in contact with the via 730. In some embodiments, the bonding pad 10 is electrically connected to the main component 710 through the via 730 for conducting electricity. In some embodiments, a top surface 102 of the bonding pad 10 is coplanar with the upper surface 742 of the dielectric layer 740. In some embodiments, the bonding pad 10 has a thickness of less than 0.2 μm.

Notably, the metallic layer 760 sunken into the dielectric layer 740 is subjected to mechanical stress during the planarizing process. The stress often causes a distortion of the bonding pad 10 that creates cracks at the corner of the bonding pad 10, which creates bonding defects or the deterioration of the semiconductor structure 70. Accordingly, the contours of the bonding pad 10 are designed to have the included angle $\alpha$, $\beta$, $\varphi$, $\delta$, in order to release stress during the planarizing process. In addition, the bridge members 40 disposed between the inner ring member 20 and the outer ring member 30 are used for preventing the dielectric layer 740 from being over-polished, while spaces between the inner ring 20, the outer ring 30, and the bridge members 40 may be used for heat dissipation.

FIGS. 13 through 16 illustrate the formation of a semiconductor structure 70A in accordance with alternative embodiments of the present disclosure. Unless specified otherwise, the materials and formation methods of the components in these embodiments are essentially the same as those of the like components, which are denoted by like reference numerals, in the embodiments shown in FIGS. 4 through 12. The details of the like components shown in FIGS. 13 through 16 may thus be found in the discussion of the embodiments shown in FIGS. 4 through 12.

Figure 13:
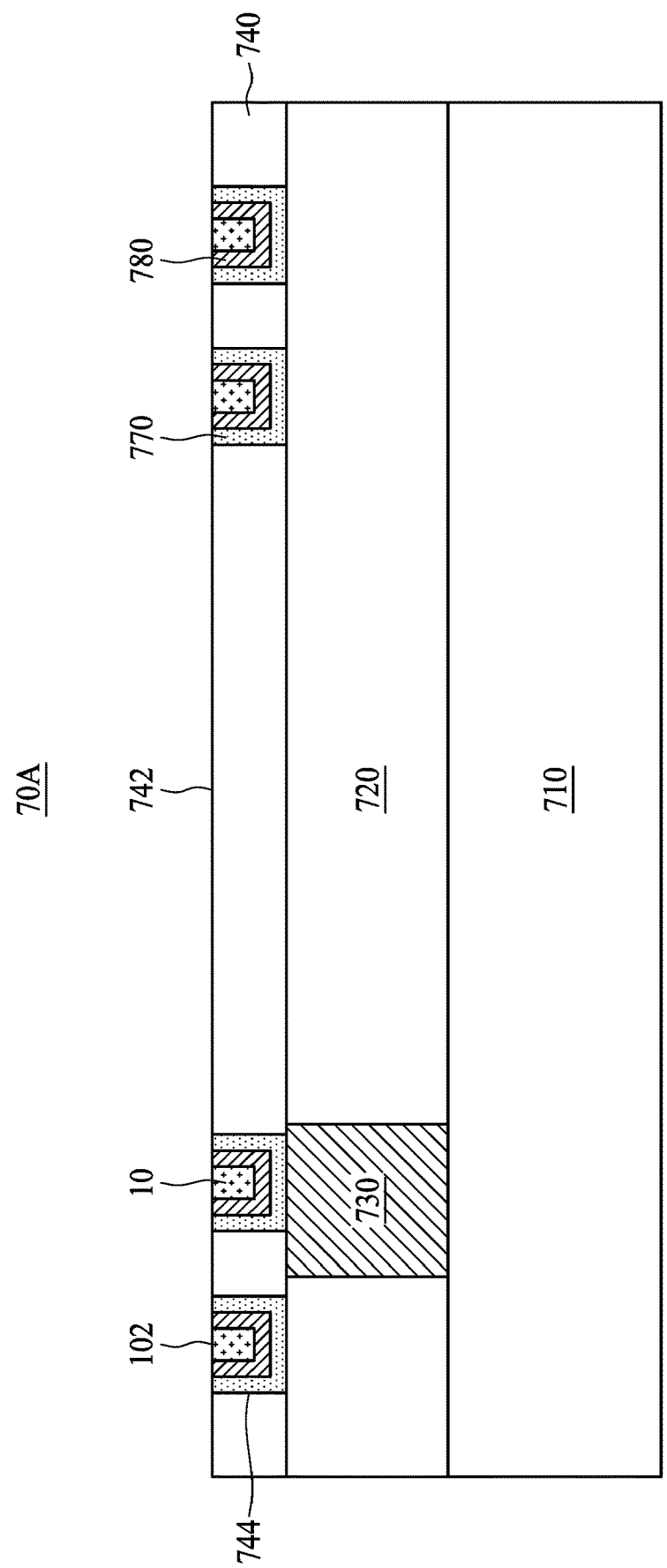
FIG. 13 illustrates a cross-sectional view of a semiconductor structure, in accordance with some alternative embodiments of the present disclosure.

Referring to FIG. 13, in some embodiments, the semiconductor structure 70A further includes a barrier layer 770 and a seed layer 780 disposed in a recessed pattern 744 of a dielectric layer 740, wherein the bonding pad 10 is surrounded by the seed layer 780, and the barrier layer 770 encircles the seed layer 780. In some embodiments, the barrier layer 770 is in contact with the insulating layer 720 and the via 730.

Figure 14:
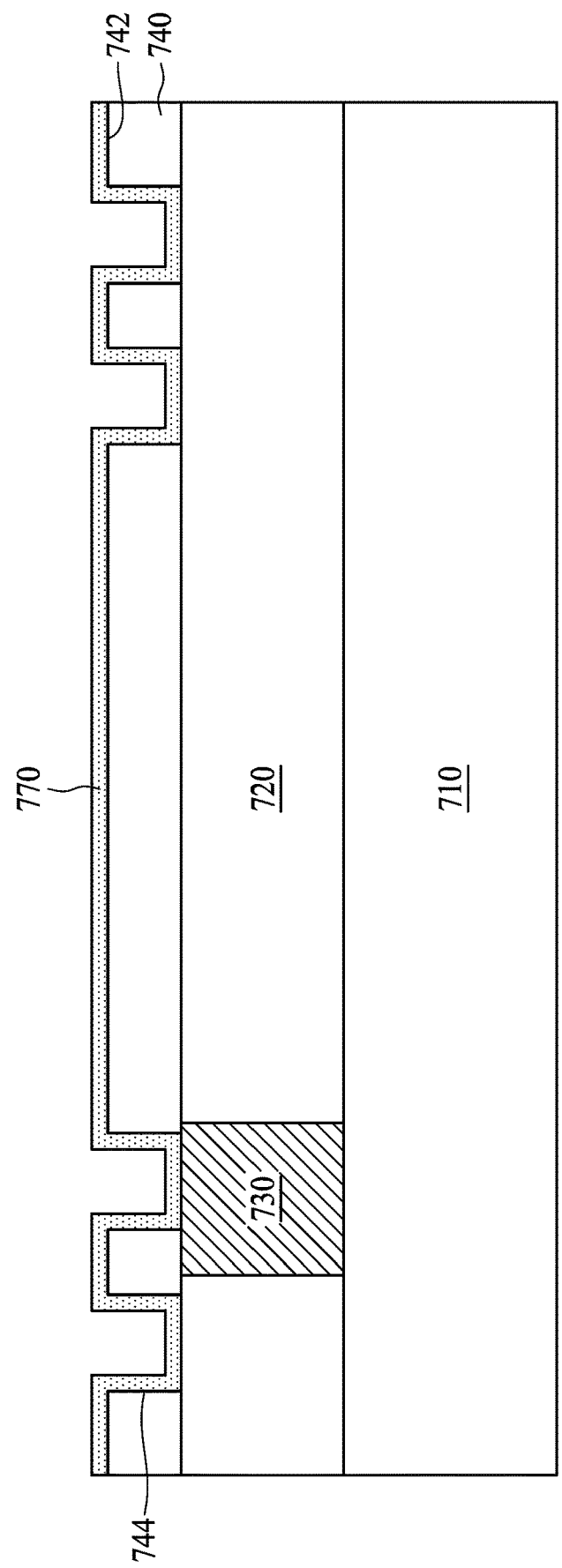
FIGS. 14 through 16 illustrate cross-sectional views of intermediate stages in the formation of the semiconductor structure, in accordance with some embodiments of the present disclosure.
Figure 15:
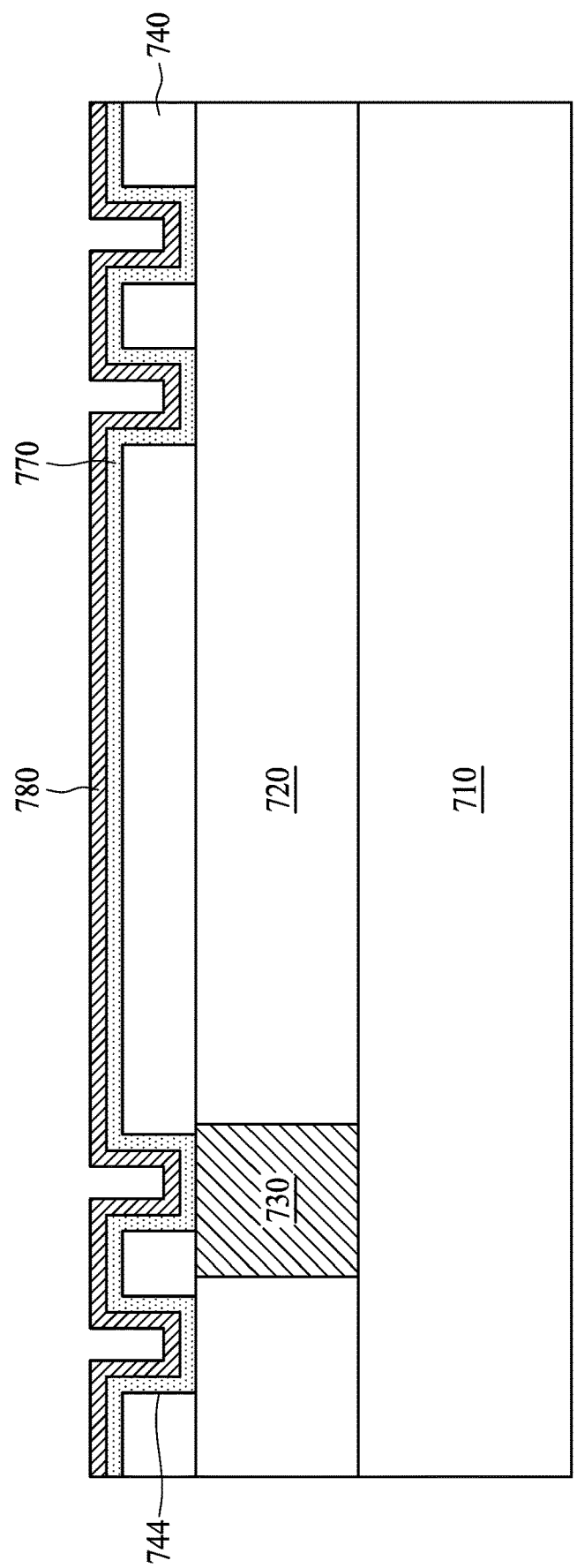
Figure 16:
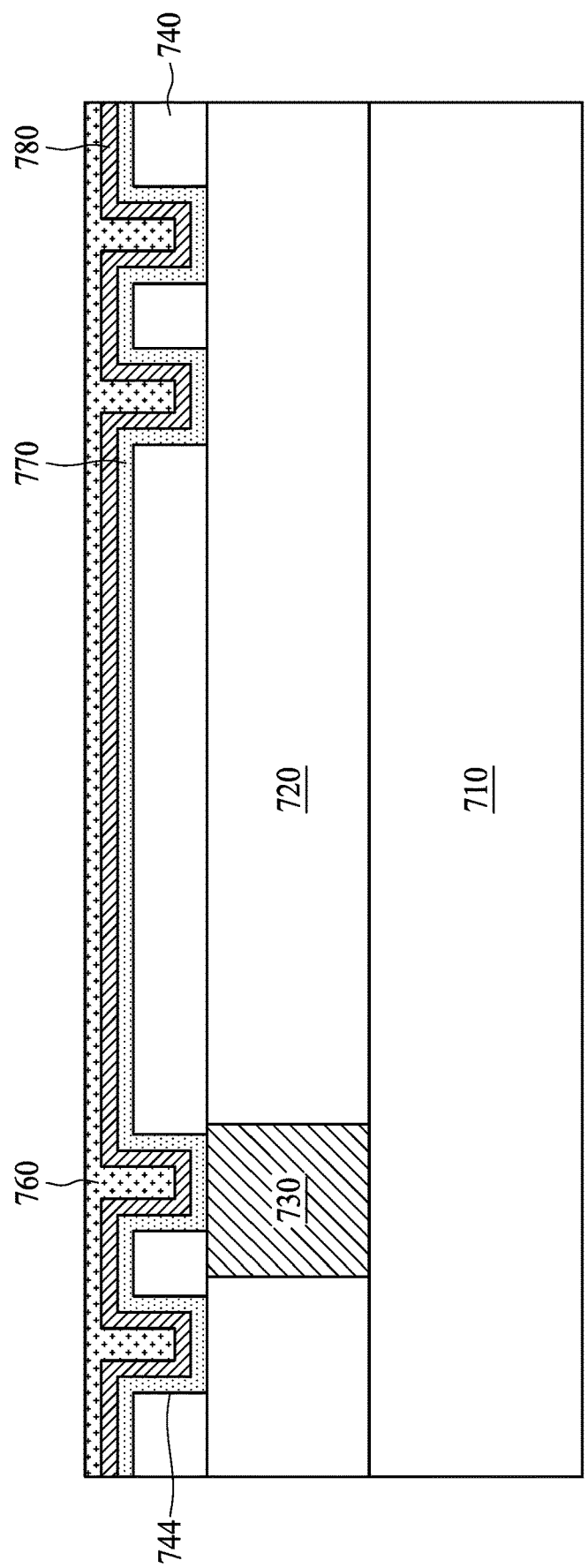

The formation process of the semiconductor device 70A is similar to the process for forming the semiconductor structure 70 shown in FIGS. 11 and 12, except the formation of the semiconductor structure 70A includes additional steps after the forming of the recessed pattern 744. For example, FIGS. 14 through 16 illustrate cross-sectional views of intermediate stages in the formation of the semiconductor structure 70A shown in FIG. 13. In these exemplary embodiments, after formation of the recessed pattern 744, the barrier layer 770 is deposited to extend along an upper surface 742 of the dielectric layer 740 and into the recessed pattern 744 according to a step 616 in FIG. 3. In some embodiments, the barrier layer 770 acts as a glue layer. In some embodiments, the barrier layer 770 is a substantially conformal layer. In some embodiments, the barrier layer 770 may include titanium (Ti), titanium nitride (TiN), tantalum (Ta), tantalum nitride (TaN), titanium silicon nitride (TiSN), tantalum silicon nitride (TaSiN), or the like. In some embodiments, the barrier layer 770 may be formed by physical vapor deposition (PVD), for example.

Referring to FIG. 15, in some embodiments, the seed layer 780 is deposited on the barrier layer 770 according to a step 618 in FIG. 3. In some embodiments, the seed layer 780 may be blanket formed on the barrier layer 770. In some embodiments, the seed layer 780 has a uniform thickness. In some embodiments, the seed layer 780 includes copper or copper alloys, and metals such as tungsten, silver, gold, aluminum, and combinations thereof may also be included. In some embodiments, the seed layer 780 is formed through a PVD process. In other embodiments, other methods such as electro-plating or electro-less plating may be used.

Referring to FIG. 16, in some embodiments, a metallic layer 760 is deposited on the seed layer 780 according to a step 620 in FIG. 3. The process steps and the material for forming the metallic layer 760 may be found by referring to the embodiments shown in FIG. 10. In some embodiments, a CMP process is then performed to remove portions of the metallic layer 760, the seed layer 780, and the barrier layer 770 above the upper surface 742 of the dielectric layer 740 to form the bonding pad 10 according to a step 622 in FIG. 3, and hence the semiconductor structure 70A shown in FIG. 13 is completely formed. In the resulting structure, the upper surface 742 of the dielectric layer 740 is coplanar with a top surface 102 of the bonding pad 10.

One aspect of the present disclosure provides a bonding pad. The bonding pad includes an inner ring member, an outer ring member, and a plurality of bridge members. The inner ring member has a pair of first inner edges being opposite to each other, a pair of second inner edges being opposite to each other, and a plurality of third inner edges disposed at corners defined by extending lines of the first inner edges and the second inner edges, wherein the first inner edges are connected to the second inner edges through the third inner edges. The outer ring member encircles the inner ring member and is spaced apart from the inner ring member. The outer ring member has a pair of first outer edges being opposite to each other, a pair of second outer edges being opposite to each other, and a plurality of third outer edges disposed at corners defined by extending lines of the first outer edges and the second outer edges, wherein the first outer edges are connected to the second outer edges through the third outer edges. The bridge members are disposed between the inner ring member and the outer ring member, and connect the inner ring member to the outer ring member.

One aspect of the present disclosure provides a semiconductor structure. The semiconductor structure includes a multilayer component, a dielectric layer, and a bonding pad. The dielectric layer is disposed on the multilayer component. The bonding pad is disposed in the dielectric layer and includes an inner ring member, an outer ring member, and a plurality of bridge members. The inner ring member has a pair of first inner edges being opposite to each other, a pair of second inner edges being opposite to each other, and a plurality of third inner edges disposed at corners defined by extending lines of the first inner edges and the second inner edges. The first inner edges are connected to the second inner edges through the third inner edges. The outer ring member encircles the inner ring member and is spaced apart from the inner ring member. The outer ring member has a pair of first outer edges being opposite to each other, a pair of second outer edges being opposite to each other, and a plurality of third outer edges disposed at corners defined by extending lines of the first outer edges and the second outer edges. The first outer edges are connected to the second outer edges through the third outer edges. The bridge members are disposed between the inner ring member and the outer ring member, and connect the inner ring member to the outer ring member.

One aspect of the present disclosure provides a method of manufacturing a semiconductor structure. The method includes steps of providing a multilayer component; depositing a dielectric layer on the multilayer component; creating a recessed pattern in the dielectric layer; and depositing a metallic layer in the recessed pattern.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, m presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A bonding pad, comprising:
    an inner ring member having a pair of first inner edges being opposite to each other, a pair of second inner edges being opposite to each other, and a plurality of third inner edges disposed at corners defined by extending lines of the first inner edges and the second inner edges, wherein the first inner edges are connected to the second inner edges through the third inner edges;
    an outer ring member encircling the inner ring member and spaced apart from the inner ring member, wherein the outer ring member has a pair of first outer edges being opposite to each other, a pair of second outer edges being opposite to each other, and a plurality of third outer edges disposed at corners defined by extending lines of the first outer edges and the second outer edges, wherein the first outer edges are connected to the second outer edges through the third outer edges; and
    a plurality of bridge members disposed between the inner ring member and the outer ring member and connecting the inner ring member to the outer ring member.

2. The bonding pad of claim 1, wherein an included angle between the third inner edge and the first inner edge is about 135 degrees, and an included angle between the third inner edge and the second inner edge is about 135 degrees.

3. The bonding pad of claim 2, wherein the first outer edges are substantially parallel to the first inner edges, and the second outer edges are substantially parallel to the second inner edges.

4. The bonding pad of claim 1, wherein a first distance between two adjacent bridge members connected to the first inner edges is substantially less than a second distance between two adjacent bridge members connected to the second inner edges.

5. The bonding pad of claim 1, wherein the inner ring member further comprises a plurality of inner notches disposed on the first inner edges and the second inner edges and a plurality of outer notches disposed on the first outer edges and the second outer edges.

6. The bonding pad of claim 5, wherein the inner notches are equidistant from the third inner edges, and the outer notches are equidistant from the third outer edges.

7. The bonding pad of claim 6, wherein the inner notches are arranged at positions between the third inner edges and the bridge member disposed closest to the third inner edges, and the outer notches are disposed at positions between the third outer edges and the bridge member disposed closest to the third outer edges.

8. The bonding pad of claim 6, wherein the inner notch and the outer notch, disposed on the first inner edge and first outer edge, respectively, or disposed on the second inner edge and the second outer edge, respectively, are arranged away from each other.

9. The bonding pad of claim 1, wherein the inner ring member and the outer ring member have a uniform width.

10. The bonding pad of claim 8, wherein the width of the inner ring member is equal to twice a width of the bridge members.

11. A semiconductor structure, comprising:
- a multilayer component;
- a dielectric layer disposed on the multilayer component; and
- a bonding pad disposed in the dielectric layer and comprising:
  - an inner ring member having a pair of first inner edges being opposite to each other, a pair of second inner edges being opposite to each other, and a plurality of third inner edges disposed at corners defined by extending lines of the first inner edges and the second inner edges, wherein the first inner edges are connected to the second inner edges through the third inner edges;
  - an outer ring member encircling the inner ring member and spaced apart from the inner ring member, wherein the outer ring member has a pair of first outer edges being opposite to each other, a pair of second outer edges being opposite to each other, and a plurality of third outer edges disposed at corners defined by extending lines of the first outer edges and the second outer edges, wherein the first outer edges are connected to the second outer edges through the third outer edges; and
  - a plurality of bridge members disposed between the inner ring member and the outer ring member and connecting the inner ring member to the outer ring member.

12. The semiconductor structure of claim 11, wherein the multilayer component comprises:
- a main component;
- an insulating layer disposed on the main component; and
- at least one via disposed in the insulating layer, wherein the main component is electrically coupled to the bonding pad through the via.

* * * * *